(12) United States Patent
Stabile et al.

(10) Patent No.: US 7,106,593 B2
(45) Date of Patent: Sep. 12, 2006

(54) HEAT SINK ASSEMBLY FOR A POTTED HOUSING

(75) Inventors: David J Stabile, Elmira Heights, NY (US); Craig S. Weber, Erin, NY (US)

(73) Assignee: Motor Components, LLC, Elmira Heights, NY (US)

( * ) Notice: Subject to any disclaimer, the term of this patent is extended or adjusted under 35 U.S.C. 154(b) by 206 days.

(21) Appl. No.: 10/709,000

(22) Filed: Apr. 6, 2004

(65) Prior Publication Data

US 2005/0219818 A1   Oct. 6, 2005

(51) Int. Cl.
*H05K 7/20* (2006.01)

(52) U.S. Cl. ............... 361/707; 361/704; 361/709; 165/80.2; 174/520; 174/521

(58) Field of Classification Search ........... 361/707, 361/719, 688, 702, 704; 174/16.3, 520–521
See application file for complete search history.

(56) References Cited

U.S. PATENT DOCUMENTS

| | | | |
|---|---|---|---|
| 3,522,486 A * | 8/1970 | Norman et al. ............ 361/751 |
| 3,699,937 A | 10/1972 | De Petris |
| 3,783,345 A | 1/1974 | Taylor et al. |
| 3,797,522 A | 3/1974 | Carleton |
| 4,035,109 A | 7/1977 | Drath et al. |
| 4,042,955 A | 8/1977 | Imai et al. |
| 4,160,629 A | 7/1979 | Hidden et al. |
| 4,169,696 A | 10/1979 | Brown |
| 4,288,839 A * | 9/1981 | Prager et al. ............. 361/717 |
| 4,299,544 A | 11/1981 | Masaka |
| 4,306,842 A | 12/1981 | Masaka |
| 4,464,613 A | 8/1984 | Brown |
| 4,502,090 A * | 2/1985 | Sloan ................... 361/153 |
| 4,643,653 A | 2/1987 | Masaka et al. |
| 4,749,343 A | 6/1988 | Brown |
| 4,998,865 A | 3/1991 | Nakanishi et al. |
| 5,504,653 A * | 4/1996 | Murphy et al. ............. 361/704 |
| 5,593,287 A | 1/1997 | Sadakata et al. |
| 5,613,844 A | 3/1997 | Tuckey et al. |
| 5,749,516 A | 5/1998 | Humburg |
| 5,832,903 A | 11/1998 | White et al. |
| 5,908,286 A | 6/1999 | Clemmons |
| 5,961,293 A | 10/1999 | Clemmons et al. |
| 6,262,893 B1 | 7/2001 | Liu |
| 6,618,255 B1 * | 9/2003 | Fairchild ................... 361/726 |
| 2001/0051098 A1 | 12/2001 | Kenney et al. |
| 2002/0051642 A1 | 5/2002 | Hicks |
| 2003/0085791 A1 | 5/2003 | Ramahi et al. |

FOREIGN PATENT DOCUMENTS

| | | |
|---|---|---|
| DE | 3126100 | 1/1983 |
| JP | 64001261 | 1/1989 |

* cited by examiner

*Primary Examiner*—Michael Datskovsky
*Assistant Examiner*—Robert J. Hoffberg
(74) *Attorney, Agent, or Firm*—Simpson & Simpson, PLLC

(57) ABSTRACT

The present invention includes a heat sink assembly within a potted housing and a method for transferring heat within a potted housing. The heat sink assembly includes a bracket, a heat-containing element, and a self-tapping screw operatively arranged to engage the bracket and the heat-containing element. The screw presses the heat-containing element against the bracket. In some cases, the bracket is brass. In some cases, the housing is for a fuel pump and the heat-containing element includes a printed circuit board with an oscillating circuit and a heat sink.

20 Claims, 7 Drawing Sheets

HEAT SINK ASSEMBLY FOR A POTTED HOUSING

FIELD OF THE INVENTION

The present invention relates generally to an apparatus for transferring heat away from a heat-producing element within a potted housing. More particularly, the present invention relates to an apparatus for transferring heat away from a heat-producing element within a potted housing for a fuel pump. Even more particularly, the present invention relates to an apparatus for conductively transferring heat away from an oscillating circuit for an integral fuel pump.

BACKGROUND OF THE INVENTION

To protect and stabilize components contained within a housing, it is known to fill the housing with a flowable material, such as epoxy. The flowable material surrounds the components and subsequently hardens in place around the components, holding the components within the matrix formed by the flowable material within the housing. This practice, commonly referred to as "potting," is used in a wide variety of applications. A fuel pump will be used as one example in the following discussion. However, it should be understood that the discussion is applicable to a much wider range of applications. Fuel pumps are subject to a number of environmental stresses, such as vibration, shock, and exposure to aggressive chemicals, such as petroleum-based compounds or salt solutions. To protect relatively delicate components, such as electronic circuitry, contained within a pump housing from the aforementioned environmental stresses, it is know to pot a pump housing.

Power and control circuitry in a fuel pump, for example, an oscillating circuit, produce heat, which must be removed to protect the circuitry. If the circuitry is not adequately cooled, circuit components can suffer heat-induced damage, the operation of the circuitry may be compromised, and the operating life of the circuitry can be dramatically shortened. Certain modes of operation for a fuel pump, for example, running the pump "dry," that is, running the pump when there is no fuel in the associated fuel tank and thus no fuel flowing through the pump, increase the ambient temperature of the housing. In dry run conditions, failure of circuitry due to thermal overload occurs much more quickly than under normal operation conditions.

In general, heat can be transferred from circuitry by convection, for example, by air passing over the circuitry, by radiation, or by conduction. Unfortunately, potting materials prevent heat transfer by radiation and convection. Thus, for a potted fuel pump, conduction is the only means of heat transfer available for components within the fuel pump housing. Thus, to conduct sufficient heat away from circuitry in a potted fuel pump, a heat sink must have adequate capacity and a tight conductive connection between the circuitry and the heat sink. Known fuel pumps suffer from a lack of sufficient heat sinking capability and/or fail to maintain the required conductive contact between the circuitry and the heat sinking capacity available in the pump.

Thus, there has been a longfelt need for a heat sink assembly to adequately conduct heat away from components in a potted housing, particularly under adverse conditions, such a dry pumping.

SUMMARY OF THE INVENTION

The present invention includes a heat sink assembly within a potted housing and a method for transferring heat within a potted housing. The heat sink assembly includes a bracket, a heat-containing element, and a self-tapping screw operatively arranged to engage the bracket and the heat-containing element. The screw presses the heat-containing element against the bracket. In some cases, the bracket is brass. In some cases, the housing is for a fuel pump and the heat-containing element includes a printed circuit board with an oscillating circuit and a heat sink.

A general object of the present invention is to provide an apparatus to enhance heat removal from components located in a potted housing.

Another object of the present invention is to provide an apparatus to enhance heat removal from electrical or electronic components located in a potted housing.

A further object of the present invention is to provide an apparatus to enhance heat removal from power and control circuits located in a potted housing for a fuel pump.

Still anther object of the present invention is to provide a means to maintain adequate physical contact between a heat-containing component located in a potted housing and a heat sink located in the potted housing.

Yet another object of the present invention is to provide a means to adequately conduct heat from an oscillator circuit located in a potted housing for a fuel pump.

These and other objects, features and advantages of the present invention will become readily apparent to those having ordinary skill in the art upon a reading of the following detailed description of the invention in view of the drawings and claims.

BRIEF DESCRIPTION OF THE DRAWINGS

The nature and mode of operation of the present invention will now be more fully described in the following detailed description of the invention taken with the accompanying drawing Figures in which.

DETAILED DESCRIPTION OF THE INVENTION

At the outset, it should be appreciated that like drawing numbers on different drawing views identify substantially identical structural elements of the invention. While the present invention is described with respect to what is presently considered to be the preferred embodiments, it is understood that the invention is not limited to the disclosed embodiments.

Furthermore, it is understood that this invention is not limited to the particular methodology, materials and modifications described and as such may, of course, vary. It is also understood that the terminology used herein is for the purpose of describing particular embodiments only, and is not intended to limit the scope of the present invention, which is limited only by the appended claims.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

Figure 1:
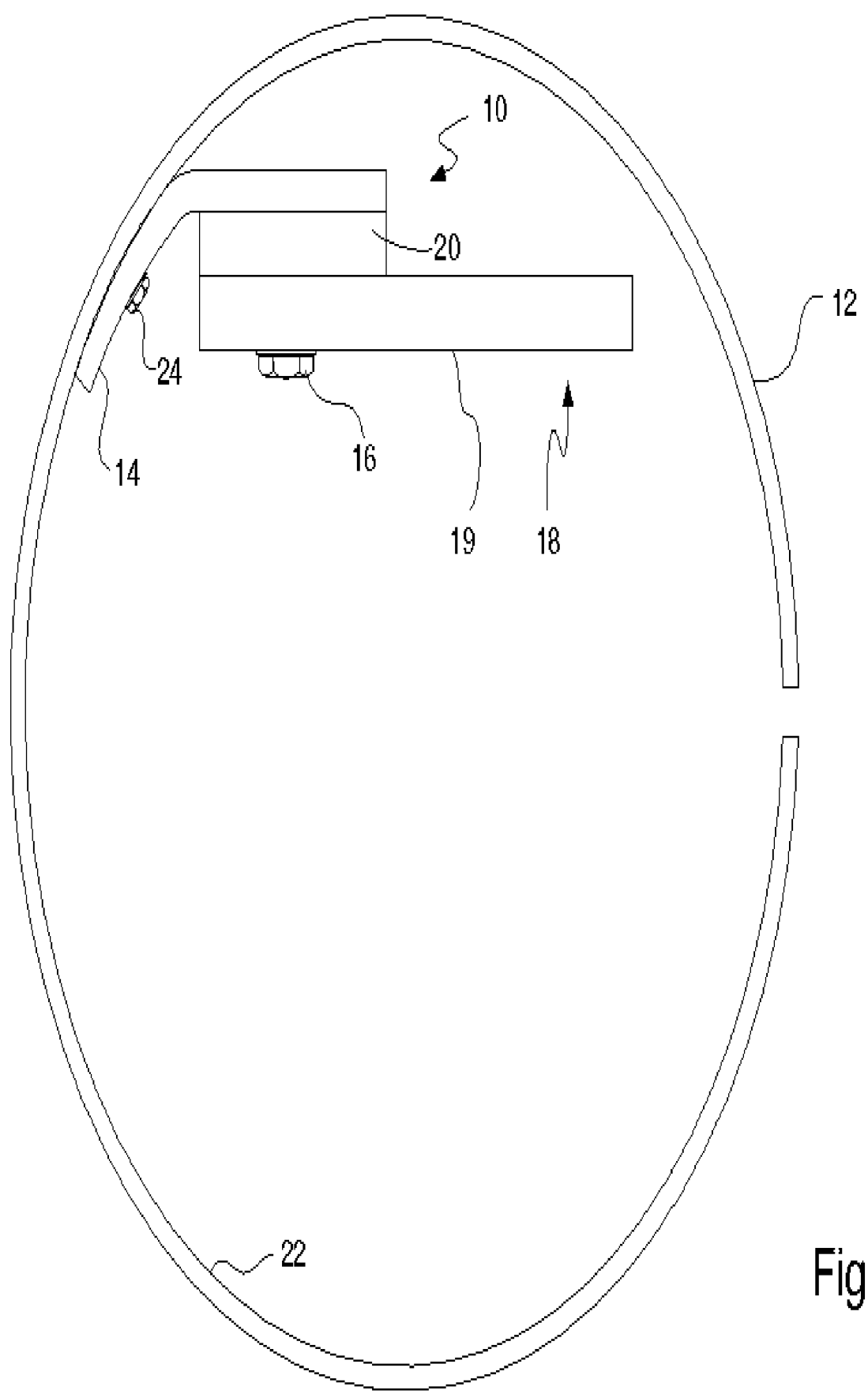
FIG. 1 is a plan view of a present invention heat sink assembly in a potted housing.

FIG. 1 is a plan view of a present invention heat sink assembly 10 in a potted housing 12.

Figure 2:
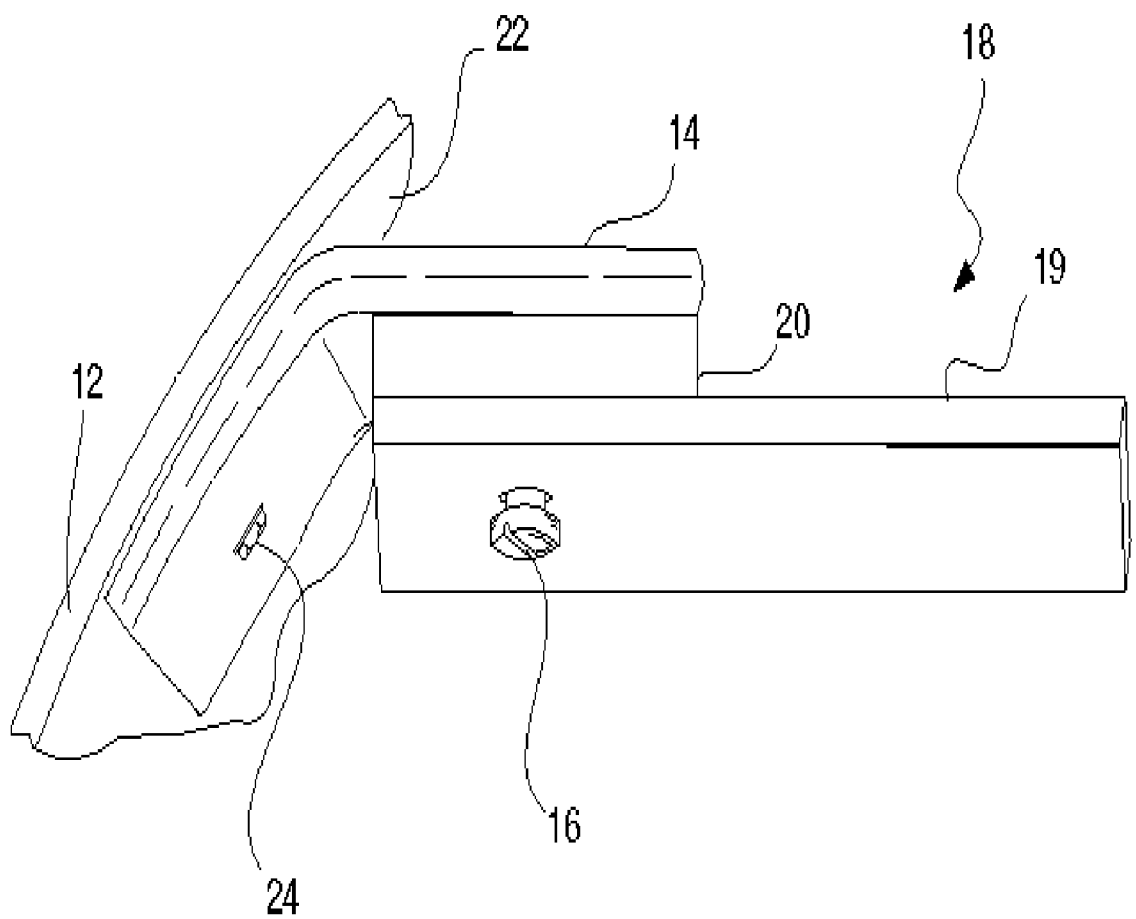
FIG. 2 is a partial perspective view of the heat sink assembly shown in FIG. 1.

FIG. 2 is a partial perspective view of the heat sink assembly 10 shown in FIG. 1.

Figure 3:
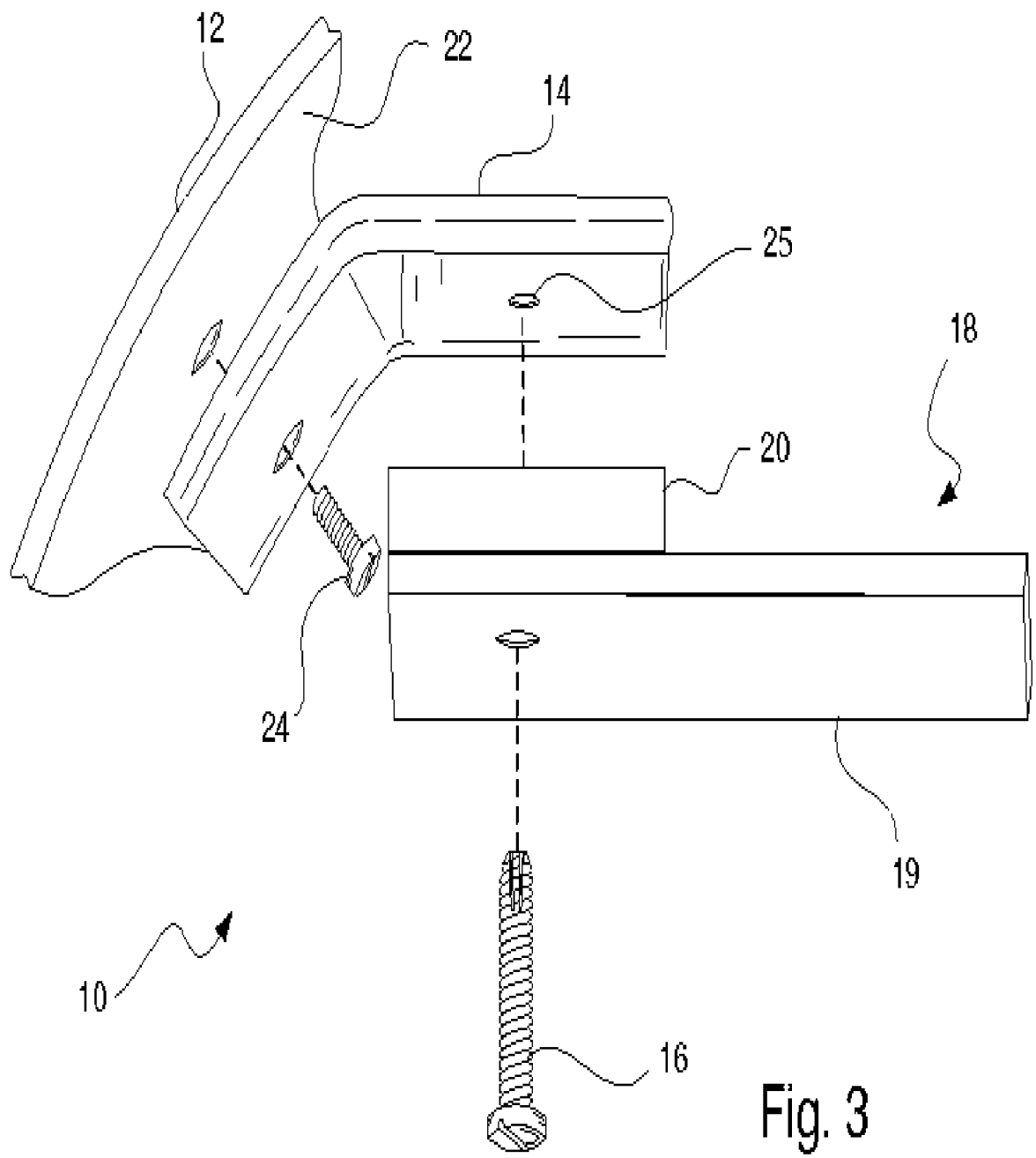
FIG. 3 is an exploded perspective view of the heat sink assembly shown in FIG. 2.

FIG. 3 is an exploded perspective view of the heat sink assembly 10 shown in FIG. 2. The following should be viewed in light of FIGS. 1 through 3. Assembly 10 includes bracket 14, self-tapping screw 16, and element 18. Element 18 is held in contact with bracket 14 by screw 16. In general, element 18 is a heat-containing element or component. Typically, element 18 produces heat during operation and the heat produced by element 18 must be removed in order to ensure proper function of the element. Typically, element 18 is an electrical or electronic power or control element. In FIG. 1, element 18 includes a heat-producing component 19, which is typically some type of circuitry (not shown), and heat sink 20, which is a heat-containing component of element 18. That is, heat sink 20 receives heat from component 19. It is understood, however, that the present invention also is applicable to those aspects in which element 18 does not include a separate heat sink 20.

To simplify the visual representation of the present invention, the potting material is not shown in the figures. Potting consists of filling a housing with a flowable potting material that surrounds components within the housing. The potting material hardens into a solid or semi-solid matrix that protects the encased components from atmospheric and fluid contaminants and also physically stabilizes the components, thereby protecting the components from environmental stresses such as vibration and shock. The type of potting material used is not germane to the present invention, and can include epoxy, epoxy urethane, silicon, one and two-part resins, or any other potting material known in the art.

In general, screw 16 holds element 18 against bracket 14 to enable conductive heat transfer between element 18 and bracket 14. Bracket 14 acts as a heat sink absorbing heat from element 18. When element 18 includes heat sink 20, screw 16 holds heat sink 20 against bracket 14. Bracket 14 also can conduct heat to wall 22 of housing 12. Bracket 14 is connected to wall 22 by screw 24. However, it should be understood that bracket 14 can be attached to wall 22 using any other method known in the art, including, but not limited to riveting, brazing, soldering, or welding. In some embodiments, a layer of thermal compound (not shown) is placed between bracket 14 and wall 22.

As noted supra, potting has the undesired affect of reducing heat transfer from components encased in the potting material. In fact, potting eliminates heat transfer by radiation and convection, leaving only conduction, that is, heat transfer by direct contact of a heat-containing element to a heat-sinking element. Two problems associated with conductive heat transfer in a potted housing are maintaining adequate contact between heat-containing elements and heat-sinking elements and providing sufficient heat-sinking capacity. For example, typically, heat sink 20 does not have sufficient heat-sinking capability and must be augmented with an auxiliary heat sink.

The present invention addresses the contact problem by using self-tapping screw 16 to engage, or thread into, bracket 14, which acts as a heat-sinking element. Screw 16 simultaneously contacts element 18. Then, screw 16 is tightened, and element 18, and in particular, heat sink 20, when included in element 18, is drawn tightly against bracket 14 by the movement of screw 16 toward bracket 14. The action of screw 16 ensures adequate contact and a good thermal conductive path between element 18, or heat sink 20 as the case may be, and bracket 14. Other known fastening methods, such as rivets or tabs, loosen over time, adversely affecting the conductive bond between heat-producing and heat-sinking elements. However, a threaded connection, particularly for a self-tapping screw, is much less prone to loosening over time. In the embodiments shown, screw 16 is installed in pilot hole 25. However, it should be understood that screw 16 also can be modified for installation without a pilot hole (not shown). In some embodiments, bracket 14 is constructed of brass, a material with excellent heat-sinking characteristics. However, it should be readily apparent to one skilled in the art that bracket 14 can be made of other heat-sinking materials, such as steel or copper, and such modifications are within the spirit and scope of the invention as claimed. In some embodiments, a layer of electrically insulating material (not shown) is placed between element 18 and bracket 14 to electrically isolate element 18 from bracket 14.

In FIG. 1, screw 16 passes through element 18. However, it should be readily apparent to one skilled in the art that other means of engaging element 18 with screw 16 are possible, and such modifications are within the spirit and scope of the invention as claimed. For example, screw 16 could engage the perimeter of element 18 (not shown).

To facilitate a perimeter engagement, element 18 could include a tab, extension, or bracket (not shown) into which or against which screw 16 could connect. It also should be understood that more than one screw (not shown) can be used to hold element 18 against bracket 14.

Figure 4:
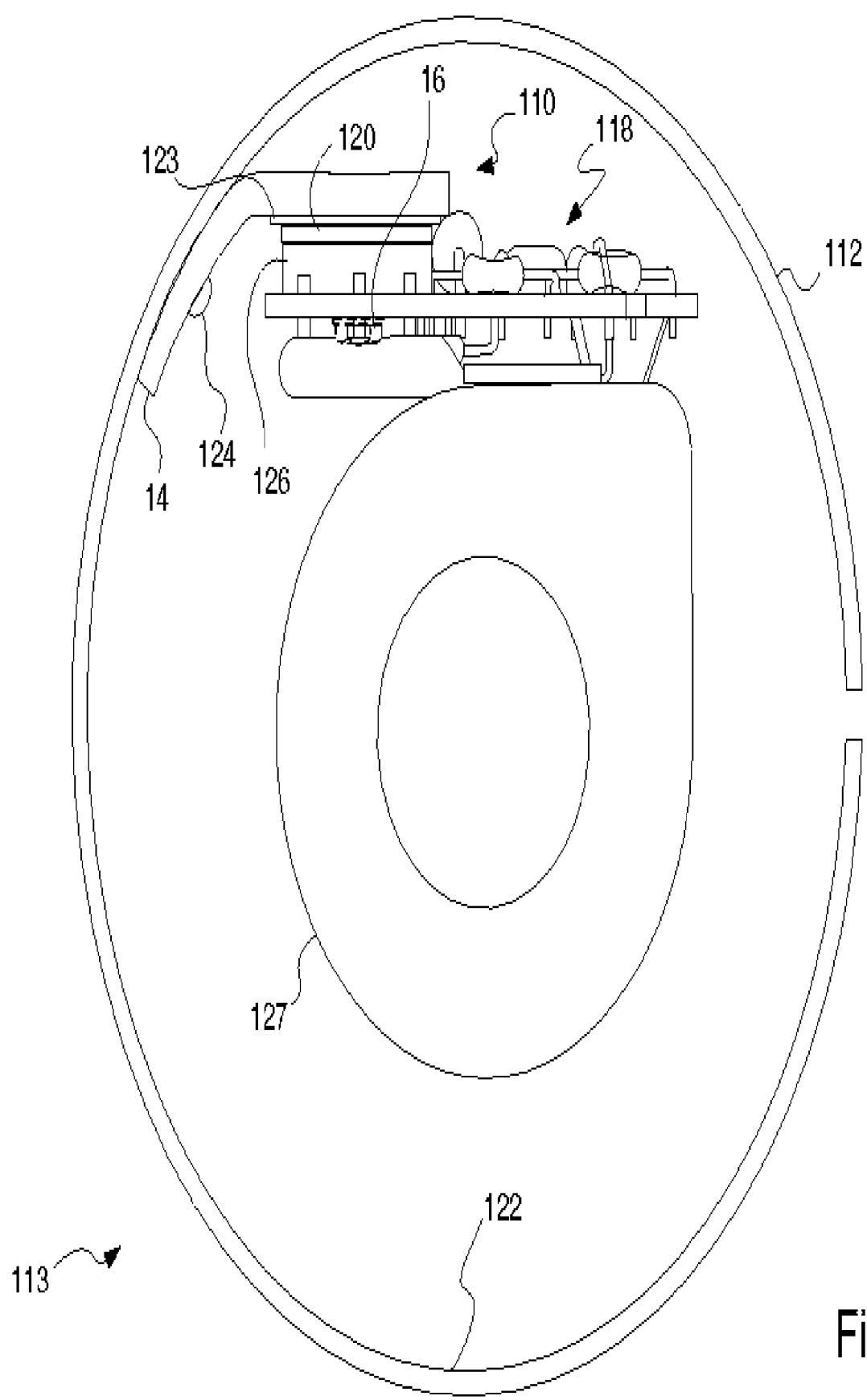
FIG. 4 is a plan view of a present invention heat sink assembly in a potted housing for an integral fuel pump.

FIG. 4 is a plan view of a present invention heat sink assembly 110 in a potted housing 112 for an integral fuel pump 113.

Figure 5:
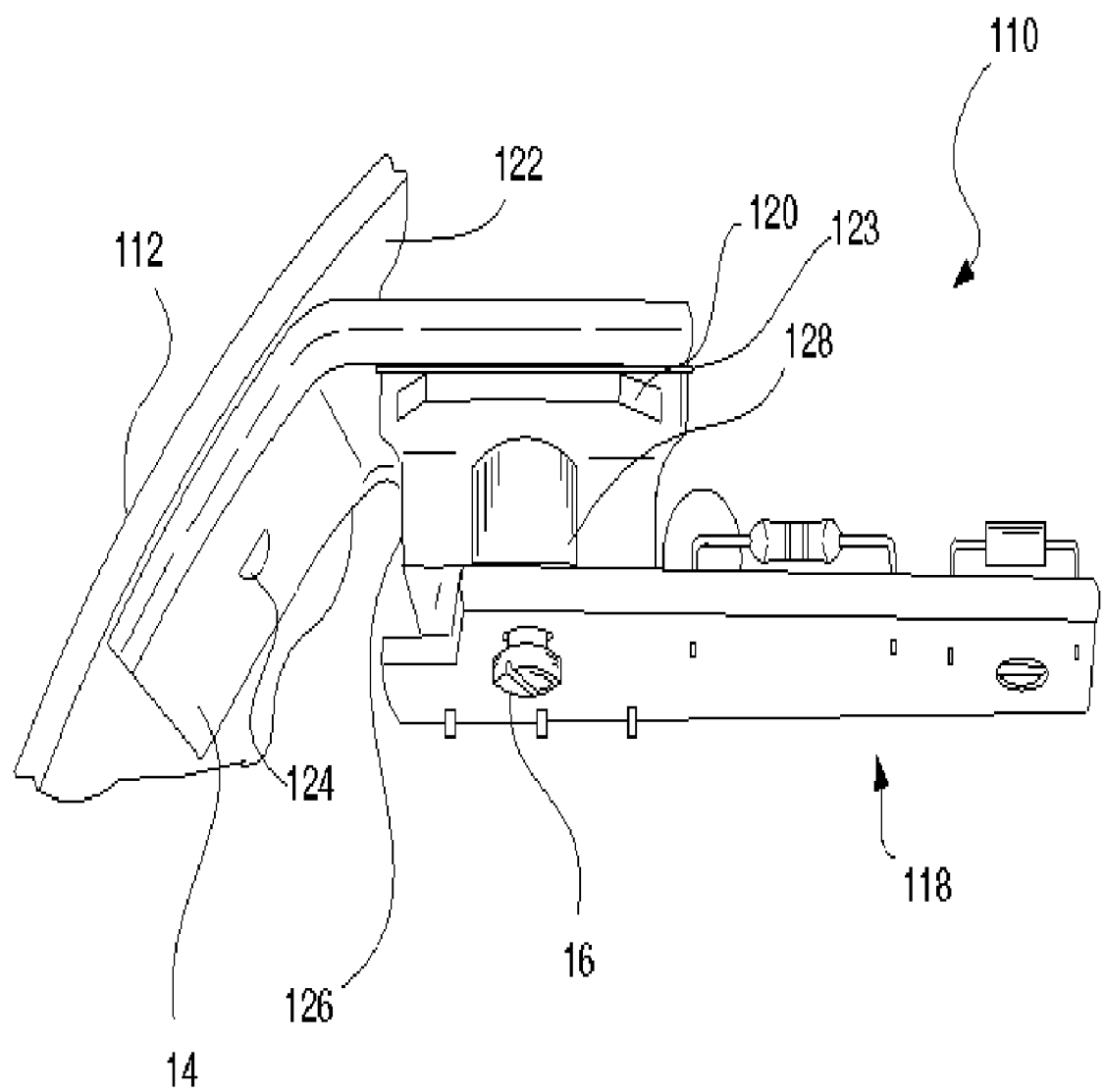
FIG. 5 is a partial perspective view of the heat sink assembly shown in FIG. 4.

FIG. 5 is a partial perspective view of the heat sink assembly 110 shown in FIG. 4.

Figure 6:
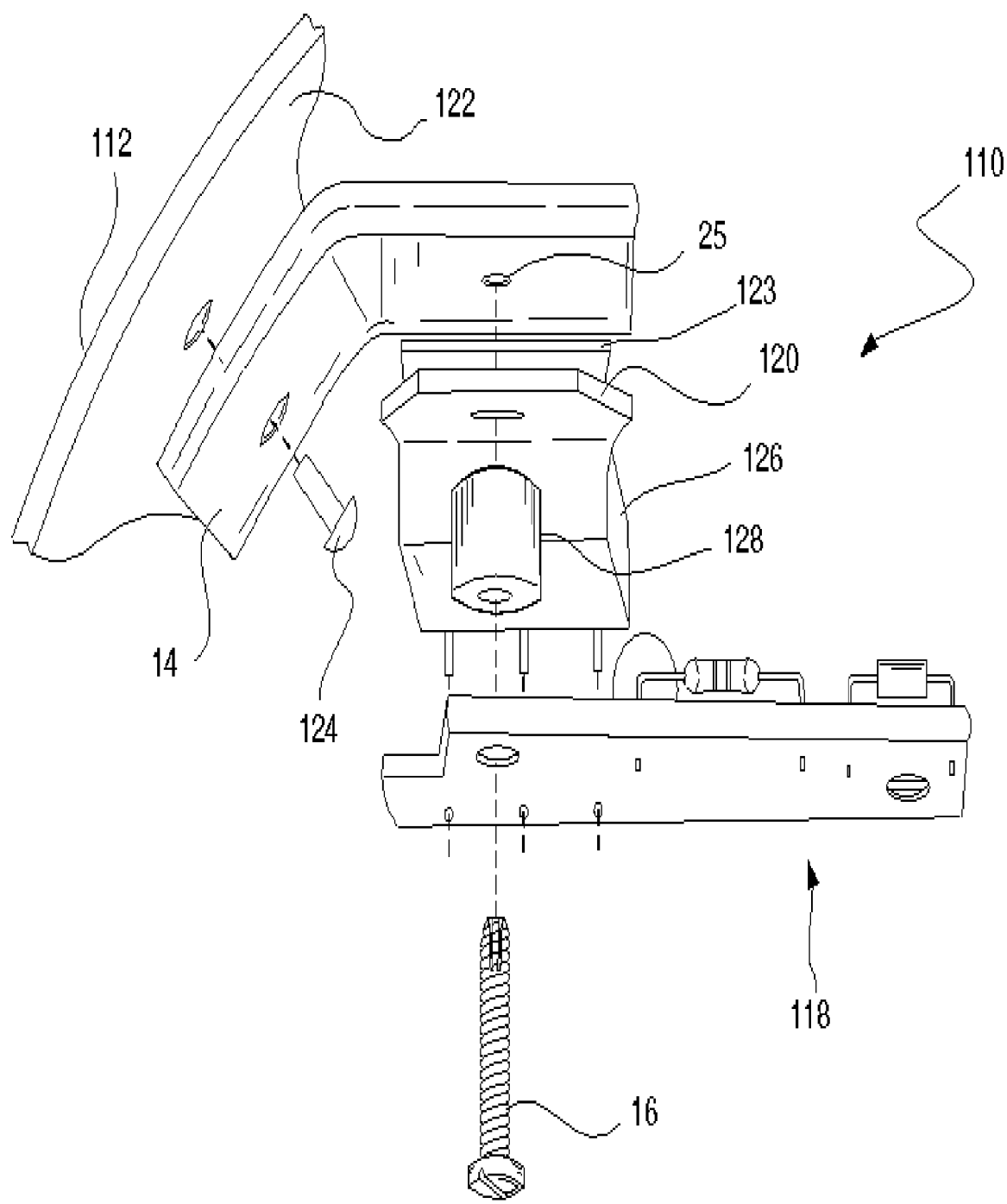
FIG. 6 is an exploded perspective view of the heat sink assembly shown in FIG. 5.

FIG. 6 is an exploded perspective view of the heat sink assembly 110 shown in FIG. 5. The following should be viewed in light of FIGS. 4 through 6. Fuel pump 113 is used as an example in FIGS. 4 through 6, however, it should be understood that the present invention is not restricted to fuel pump housings and is applicable to housings for a wide range of devices and applications. Element 118 is held in contact with bracket 14 by screw 16. A thin film of electrically insulating material 123 is placed between element 118 and bracket 14 to electrically isolate element 118 from bracket 14. The material for film 123 is chosen to maximize electrical insulation while minimizing thermal insulation. In some embodiments, film 123 is mica. In some embodiments, a layer of thermal compound (not shown) is placed on one or both sides of film 123 before inserting the film between element 118 and bracket 14. Bracket 14 is connected to wall 22 of housing 112 by rivet 124. However, it should be understood that bracket 14 can be attached to wall 122 using any other method known in the art, including, but not limited to threaded fasteners, brazing, soldering, or welding.

Element 118 is a printed circuit board (PCB). However, it should be understood that although in general, for a fuel pump, the heat-containing element is an electrical or electronic power or control element, the present invention is applicable to other components producing heat within a housing. PCB 118 includes components for an oscillator circuit including integrated circuit (IC) 126 with heat sink 120. Coil assembly 127, which motivates the pumping mechanism for fuel pump 113 in response to signals from PCB 118, is connected to PCB 118. It should be readily apparent to one skilled in the art that other circuits and circuit combinations are possible for PCB 118 and IC 126, and such modifications are within the spirit and scope of the invention as claimed. Spacer 128 is used to maintain the proper orientation of PCB 118, IC 126, and bracket 14. It should be readily apparent to one skilled in the art that other configurations are possible for spacer 128, and such modifications are within the spirit and scope of the invention as claimed.

The discussion of heat transfer in the description for FIGS. 1 through 3 applies to FIGS. 4 through 6. Specifically, heat sink 120, integral to IC 126, is arranged to absorb heat generated by IC 126. However, heat sink 120 has a limited thermal capacity. Once heat sink 120 reaches this capacity, heat sink 120 can no longer accept sufficient quantities of heat from IC 126 and IC 126 begins to suffer thermal degradation. Housing 112 is potted and as noted supra, potting eliminates cooling by convection and radiation, leaving only conduction as a thermal transfer route for removing heat from heat sink 120. Bracket 14 acts as an auxiliary heat sink, absorbing thermal energy from heat sink 120. To establish the firm contact needed for good thermal conduction between heat sink 120 and bracket 14, screw 16 engages IC 126 and presses heat sink 120 against bracket 14. This contact enables heat sink 120 to efficiently conduct heat to bracket 14 such that heat sink 120 is able to continue accepting sufficient heat from IC 126. Thus, despite the loss of convection and radiation as thermal transfer routes due to the potting in housing 112, assembly 110 provides effective heat removal for PCB 118.

Figure 7:
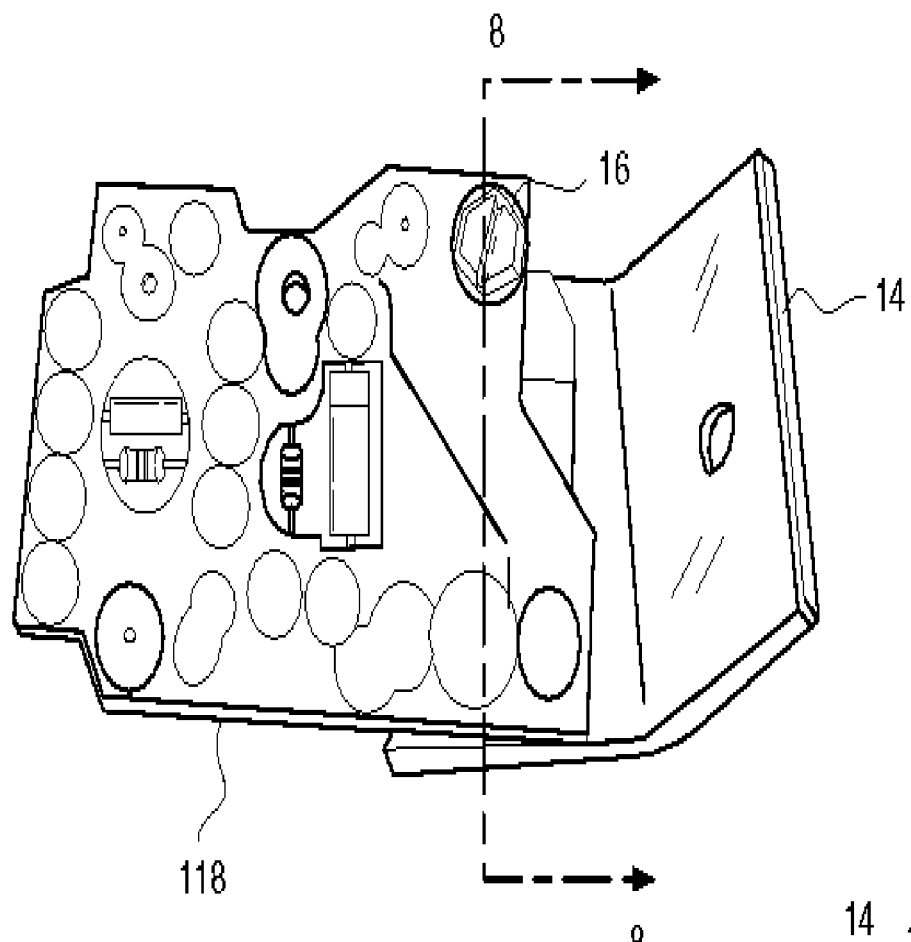
FIG. 7 is a partial perspective view showing further detail of the heat sink assembly shown in FIG. 4; and, FIG. 8 is a partial cross-sectional view taken along line 8—8 in FIG. 7.

FIG. 7 is a partial perspective view showing further detail of the heat sink assembly 110 shown in FIG. 4.

Figure 8:
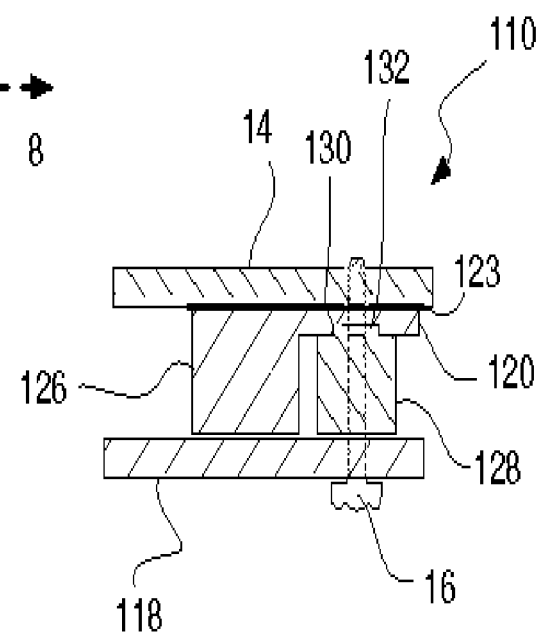

FIG. 8 is a partial cross-sectional view taken along line 8—8 in FIG. 7. Heat sink 120 includes a recess 130 and spacer 128 includes a lip 132. Recess 130 and lip 132 are configured so that lip 132 fits snuggly within recess 130. The mating of recess 130 and lip 132 helps maintain the stability of assembly 110, and thereby helps insure a firm conductive connection between bracket 14 and heat sink 120. It should be readily apparent to one skilled in the art that other configurations and combinations are possible for recess 130 and lip 132, and such modifications are within the spirit and scope of the invention as claimed.

The following should be viewed in light of FIGS. 1 through 8. Bracket 14 is shown with a particular configuration. However, the specific shape of bracket 14 is not particularly germane to the present invention. Further, it should be readily apparent to one skilled in the art that other configurations are possible for bracket 14, and such modifications are within the spirit and scope of the invention as claimed. For example, the length, width, thickness, number of bends, and angle of bends for bracket 14 can be modified to suit specific application requirements. Also, the general shape of bracket 14 can be modified. For example, bracket 14 could have tapered shapes. The particular characteristics of screw 16, for example, material of construction, diameter, length, and type of head (for example, slot or Phillips) of screw 16 are not particularly germane to the present invention. The previously mentioned characteristics can be selected to suit specific application requirements, while enhancing the heat transfer performance of assemblies 10 or 110.

"Dry run" tests were performed on 15 integral fuel pumps using the present invention heat sink assembly 110. The results of these tests were compared with known test results for dry run tests for integral fuel pumps using a known heat sink assembly (not shown). A dry run test consists of running a pump, without any fuel flowing through the pump, until failure of the pump. Hereinafter, the 15 pumps tested with assembly 110 are referred to as the improved pumps and pumps with the known heat sink assembly are referred to as the known pumps. The improved pumps and the known pumps all used an oscillating circuit to excite a plunger. The oscillating circuit and housing were potted in all cases. In general, the configuration of the oscillator circuit, heat sink, and bracket for the known heat sink assembly were as shown for heat sink assembly 110. However, for the known heat sink assembly, the bracket was made of relatively thin steel, and the heat sink was held in contact against the bracket by a rivet. For heat sink assembly 110, bracket 14 was made of brass. The known pumps are known to overheat and fail after approximately one or two hours. However, the improved pumps operated for well over 75 hours before overheating and failing, an unexpectedly good result.

This and other objects, features and advantages of the present invention will become readily apparent to those having ordinary skill in the art upon a reading of the following detailed description of the invention in view of the drawings and claims.

The invention claimed is:

1. A heat sink assembly within a potted housing, comprising:
    a bracket mounted to an interior surface of said housing;
    a heat-containing element fully enclosed within said housing; and,
    a self-tapping screw threaded into said bracket, engaging said heat-containing element, and urging said element against said bracket, wherein said housing is filled with potting material, said bracket is arranged to act as a first heat sink for said heat-containing element, and said heat-containing element is maintained in a fixed position within said housing by said bracket prior to said filling with said potting material.

2. The heat sink assembly as recited in claim 1 wherein said heat-containing element further comprises a second heat sink; and,
    wherein said self-tapping screw is operatively arranged to urge said second heat sink against said bracket.

3. The heat sink assembly as recited in claim 2 wherein said heat-containing element further comprises a printed circuit board (PCB) comprising said second heat sink.

4. The heat sink assembly as recited in claim 3 wherein said PCB further comprises an integrated circuit (IC) comprising said second heat sink.

5. The heat sink assembly as recited in claim 4 wherein said housing further comprises a housing for a fuel pump and said PCB further comprises an oscillator circuit.

6. The heat sink assembly as recited in claim 1 wherein said bracket is brass.

7. The heat sink assembly as recited in claim 1 wherein said bracket is connected to said interior surface with a fastener selected from the group including rivets and threaded fasteners.

8. A heat sink assembly in a potted housing for a fuel pump, comprising:
- a brass bracket connected to an interior wall of said housing;
- a printed circuit board (PCB) with a first heat sink, said PCB fully enclosed within said housing; and,
- a self-tapping screw threaded into said bracket, engaging said PCB, and urging said first heat sink against said bracket, wherein said housing is filled with potting material, said bracket is arranged to act as a second heat sink for said heat-containing element, and said heat-containing element is maintained in a fixed position within said housing by said bracket prior to said filling with said potting material.

9. The heat sink assembly as recited in claim 8 wherein said PCB further comprises an integrated circuit (IC) comprising said first heat sink.

10. The heat sink assembly as recited in claim 9 wherein said PCB further comprises an oscillator circuit comprising said first heat sink.

11. The heat sink assembly as recited in claim 8 wherein said bracket is connected to said interior surface with a fastener selected from the group including rivets and threaded fasteners.

12. A heat sink assembly in a potted housing for an integral fuel pump, comprising:
- a brass bracket connected to an interior wall of said housing with a rivet;
- a printed circuit board (PCB) with an oscillator circuit and a heat sink, said PCB fully enclosed within said housing; and,
- a self-tapping screw threaded into said bracket, engaging said PCB, and urging said, heat sink against said brass bracket, wherein said housing is filled with potting material, said bracket is arranged to act as a heat sink for said heat-containing element, and said heat-containing element is maintained in a fixed position within said housing by said bracket prior to said filling with said potting material.

13. A method for transferring heat within a potted housing, comprising the steps of:
- fully enclosing a heat-containing element within said potted housing;
- connecting a mounting bracket to an interior wall of said housing;
- threading a self-tapping screw into said mounting bracket;
- with said screw, engaging said heat-containing element and pressing said heat-containing element against said mounting bracket;
- maintaining, with said bracket, said heat-containing element in a fixed position within said housing;
- filling said housing with potting material; and,
- sinking heat from said heat-containing element with said bracket.

14. The method recited in claim 13 wherein said heat-containing element further comprises a circuit element with a heat sink; and, wherein said pressing further comprises pressing said heat sink against said mounting bracket.

15. The method recited in claim 14 wherein said circuit element further comprises a printed circuit board (PCB) comprising said heat sink.

16. The method recited in claim 15 wherein said PCB further comprises an integrated circuit (IC) comprising said heat sink.

17. The method recited in claim 16 wherein said housing further comprises a housing for a fuel pump and said PCB further comprises an oscillator circuit.

18. The method recited in claim 13 further comprising: forming said mounting bracket from brass.

19. The method recited in claim 13 wherein said connection further comprising connecting said mounting bracket to said interior surface using a fastener selected from the group including rivets and threaded fasteners.

20. A method for transferring heat within a potted housing for an integral fuel pump, comprising the steps of:
- fully enclosing, within said potted housing, an oscillator circuit with a heat sink;
- threadingly connecting a brass bracket to an interior wall of said housing;
- threading a self-tapping screw into said mounting bracket;
- contacting, with said self-tapping screw, said oscillator circuit with a heat sink;
- urging said heat sink against said mounting bracket with said self-tapping screw;
- maintaining, with said bracket, said heat-containing element in a fixed position within said housing;
- filling said housing with potting material; and,
- sinking heat from said heat sink with said bracket.

* * * * *